United States Patent [19]

Lynch

[11] 4,171,856

[45] Oct. 23, 1979

[54] SUBSTRATE RECESSED RECEPTACLE

[75] Inventor: James E. Lynch, Harrisburg, Pa.

[73] Assignee: AMP Incorporated, Harrisburg, Pa.

[21] Appl. No.: 899,435

[22] Filed: Apr. 24, 1978

[51] Int. Cl.[2] .................... H05K 1/12

[52] U.S. Cl. .................... 339/17 C; 339/221 M; 339/258 P; 339/275 B

[58] Field of Search .................... 339/17 R, 17 C, 256 R, 339/258 R, 258 A, 258 P, 275 B, 221 R, 221 M

[56] References Cited

U.S. PATENT DOCUMENTS

| | | | |
|---|---|---|---|
| 2,803,000 | 8/1975 | Johanson | 339/258 |
| 2,904,772 | 9/1959 | Artz | 339/275 B |
| 3,717,841 | 2/1973 | Mancini | 339/17 C |
| 3,850,491 | 11/1974 | Mouissie | 339/17 C |
| 3,864,004 | 2/1975 | Friend | 339/258 R |
| 3,922,057 | 11/1975 | Lemke et al. | 339/17 C |
| 4,070,077 | 1/1978 | Clark | 339/17 C |

FOREIGN PATENT DOCUMENTS

| | | | |
|---|---|---|---|
| 658280 | 4/1965 | Belgium | 339/17 R |
| 1038469 | 8/1966 | United Kingdom | 339/275 R |

*Primary Examiner*—Neil Abrams
*Attorney, Agent, or Firm*—Gerald K. Kita

[57] ABSTRACT

A post receiving receptacle having its blank form resemble a cross has a bottom surface with a pair of bowed contact arms bent upwardly from said bottom surface and facing each other to receive a terminal post therebetween. The top ends of the two contacts form a flared opening to facilitate post entry. A second pair of arms are bent upwardly from said bottom surface at right angles to said first pair of arms. The second pair of arms have their top ends bent outwardly to form a pair of ears which are to be bonded to conductive epoxy circuit traces on the surface of a substrate provided with a recess which wedgingly receives said receptacle. The sides of the hole provide a variable overstress support for the receptacle.

5 Claims, 9 Drawing Figures

SUBSTRATE RECESSED RECEPTACLE

FIELD OF THE INVENTION

This invention relates generally to small electrical receptacles which fit into printed circuit boards or other substrates, and more particularly, to post receiving receptacles which fit into substrate recesses spaced apart on relatively close center line spacing and capable of receiving inserted male terminals of widely varying range of cross sections.

BACKGROUND OF THE INVENTION

There are in the prior art many types of sockets made to fit into holes, including plated-through holes in printed circuit boards. Many of these small receptacles or sockets are comprised of two parts, one being an outer sleeve and the other being a contact spring within the sleeve as disclosed in U.S. Pat. No. 3,922,057. Because both a sleeve and a spring are required, the center line spacing between such mini-spring sockets is relatively large, of the order of 0.100 or more inches. Furthermore, the range of male terminal sizes which any given prior art small socket will take is relatively limited, being of the order of plus or minus 25% of the mid-range of terminal cross sections.

A further problem resides in the electrical connection of sockets to conductive paths on the substrate surface. Such a connection frequently is accomplished by soldering the lip of the socket sleeve to a conductive pad on the substrate or, alternatively, having the socket sleeve extend through the substrate for soldering to a conductive pad on the under surface of the substrate. However, certain risks exist in such a connection in that when a terminal post is inserted into a socket, strain is placed upon the solder connection causing occasional breakage and malfunction of the device.

A more recent development has been the use of conductive epoxy containing silver formed into circuit traces on the surface of the substrate. Prior to solidifying the epoxy adheres to the lip of a socket sleeve inserted in an aperture of the substrate. Again, however, the connection between the epoxy and the socket sleeve can break when a terminal is inserted into the socket.

BRIEF DESCRIPTION

In accordance with a preferred form of the invention there is provided a recess in a substrate for retaining a contact. The contact is comprised of an integral unit in blank form somewhat in the shape of a Maltese Cross, with a first pair of oppositely positioned contact arms folded upwardly thereby to provide facing convex arms with outwardly flared ends to receive a male terminal or post therebetween. The other pair of arms are also folded upwardly and along the first pair of contact arms to form a four-sided cavity, with the four sides being the folded up four arms of the Maltese Cross. Further, the upper ends of the second pair of arms are bent outwardly to form a pair of ears which will seat upon silver containing epoxy circuit traces formed on the surface of the substrate. The side edges of the second pair of arms are frictionally wedged into pairs of grooves formed in said substrate aperture to hold said second pair of arms rigidly therein. The bowed contact arms, however, are free to flex and deflect outwardly toward the side of the aperture in response to receiving a terminal or post therein. The said ears on the second pair of arms nest in a suitable bonding material such as silver entrained epoxy to form electrical as well as mechanical connections of said ears with the surface of the substrate.

In accordance with a feature of the invention, the ears extend outwardly from the second pair of arms in such a direction as to be substantially perpendicular to a row of contacts inserted in a corresponding row of apertures in a substrate, thereby avoiding interference between ears of adjacent contacts, and thereby allowing close center line spacing between adjacent contacts.

In accordance with another feature of the invention the contact requires no sleeve or plated hole in order to perform its function, occupying less substrate area, permitting closer center line spacing and also enabling a larger opening within which outward deflection of the contacts can occur. Thus, a much greater range of post or male terminal sizes can be received than can be received by prior art devices employing a socket and a spring.

It is a third feature of the invention to have the pair of bowed contact arms extend out of the top of the substrate surface to allow greater beam lengths with consequent greater flexing thereof which allows for the reception of a greater range of post or male terminal sizes.

It is a fourth feature of the invention that the bowed contacts will flex completely free of the second pair of arms and without producing an interacting force with the second pair of arms, thus avoiding the application of forces and stresses on the ears and the silvered epoxy to which they are bonded.

According to another feature, the contact arms of the receptacle are inclined toward each other and lean, therefore, away from the recess sides. When a male terminal or post is received in the receptacle, the contact arms will deflect outwardly and toward the recess sides which provide an overstress stop, limiting excessive deflection of the contact arms. The arms at the bottom of the recess are adjacent the recess sides. The arms are bowed convexly toward the sides even while leaning away therefrom. When a terminal or post is inserted in the recess, the contact arms are deflected outwardly and progressively flatten against the recess sides. A wide range of terminal sizes produce varying amounts of flattening along the lengths of the contact arms, allowing accommodation of the wide range of sizes without overstressing. Thus a large size terminal or post may be inserted and withdrawn leaving the receptacle unstressed to allow receipt of a terminal of swollen sizes in the receptacle subsequent to withdrawal of the large size terminal.

OBJECTS

It is a primary object of the invention to provide a small electrical receptacle for insertion into a substrate which receptacle can accommodate a relatively large variation in post size as compared with prior art structure.

It is another object of the invention to provide a post receiving receptacle which can fit into a non-plated aperture in a substrate and which can be spaced on relatively close center line spacings of the order of 0.100 inch.

It is another object of the invention to provide a small electrical receptacle for insertion into a nonplated hole in a substrate, and which can accept a large range of male terminal sizes and which can have relatively small center line spacings between receptacles of the order of 0.100 inch.

It is another object of the invention to provide a receptacle, for insertion into a hole in a substrate, which has ears formed thereon for being bonded to conductive epoxy on the surface of the substrate, and which prevents strain from being produced on said epoxy connection when posts or male terminals are inserted into the receptacle.

It is another object of the invention to improve small post receiving receptacles generally.

The above-mentioned and other objects and features of the invention will be more fully understood from the following detailed description thereof when read in conjunction with the drawings in which.

DETAILED DESCRIPTION OF THE INVENTION

Figure 1:
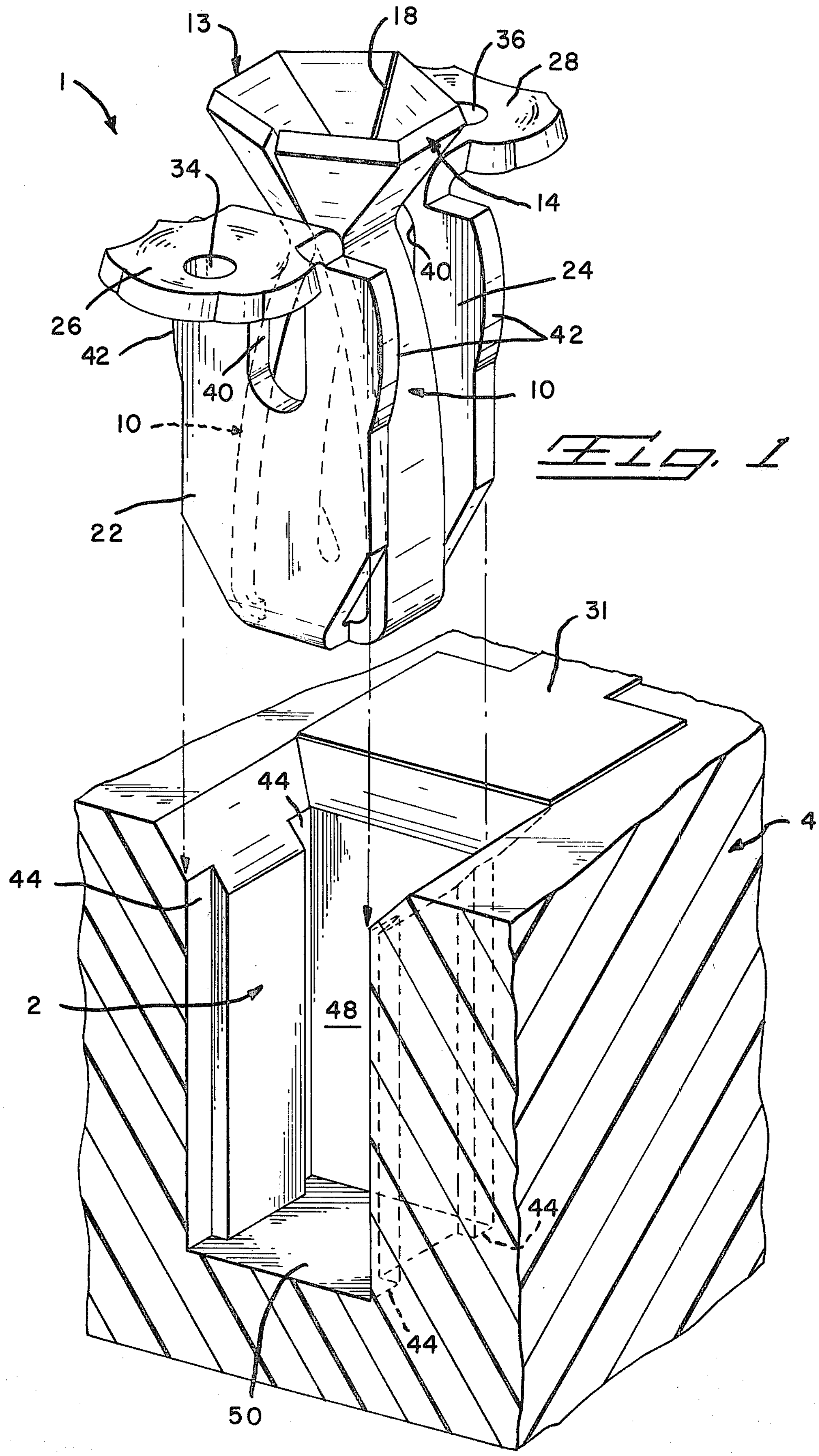
FIG. 1 is a perspective of the invention with a contact poised above a recess in a substrate immediately prior to insertion therein.
Figure 2:
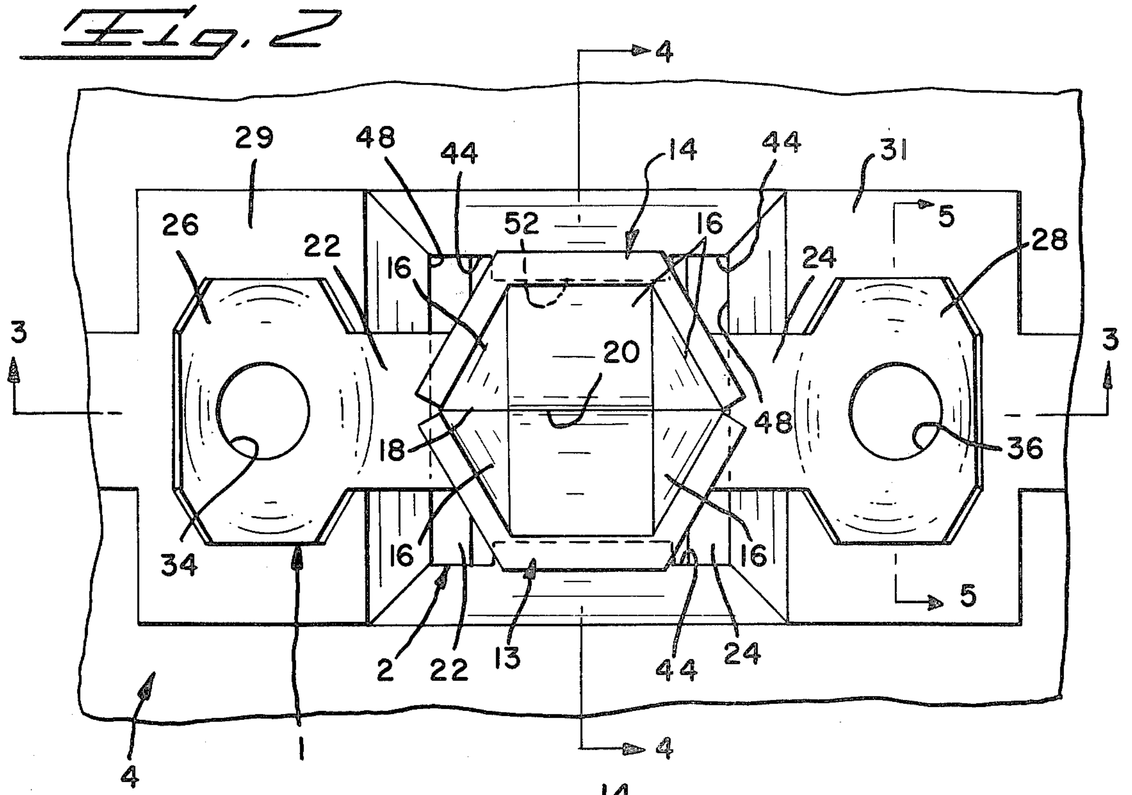
FIG. 2 is a top view of the contact fully inserted in the recess of the substrate.
Figure 4:
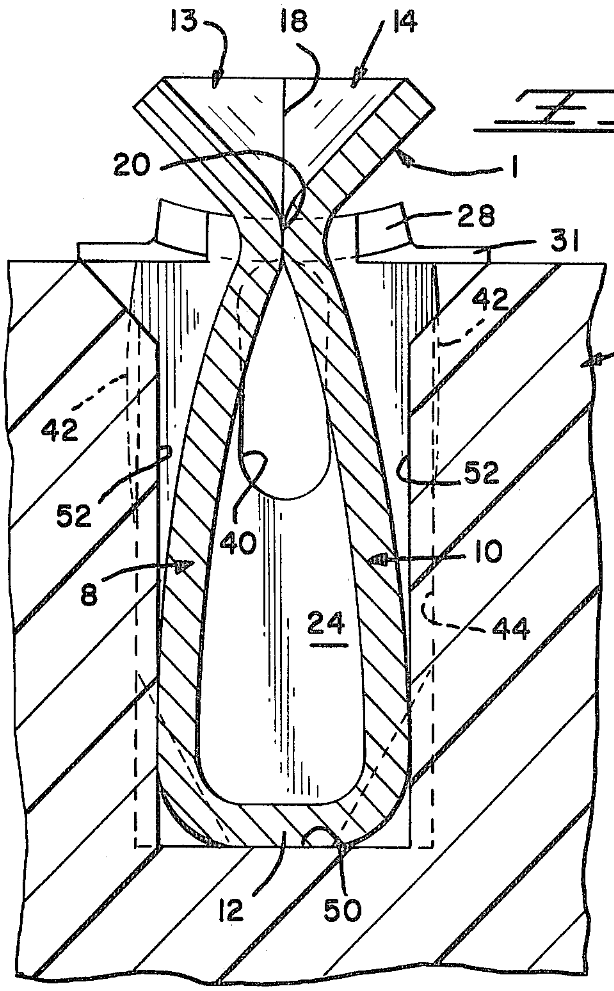
FIG. 4 is a side view in section of the structure of FIG. 2 taken along the plane 4—4.
Figure 5:
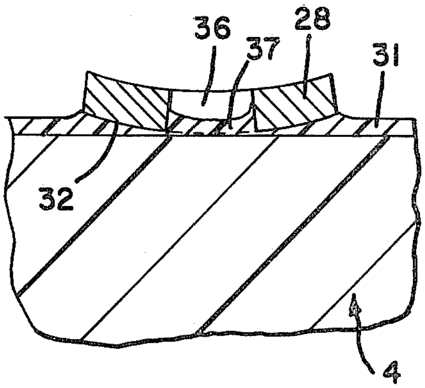
FIG. 5 is a fragmentary detailed section of ears of the contact bonded to conductive epoxy on the surface of the substrate.
Figure 8:
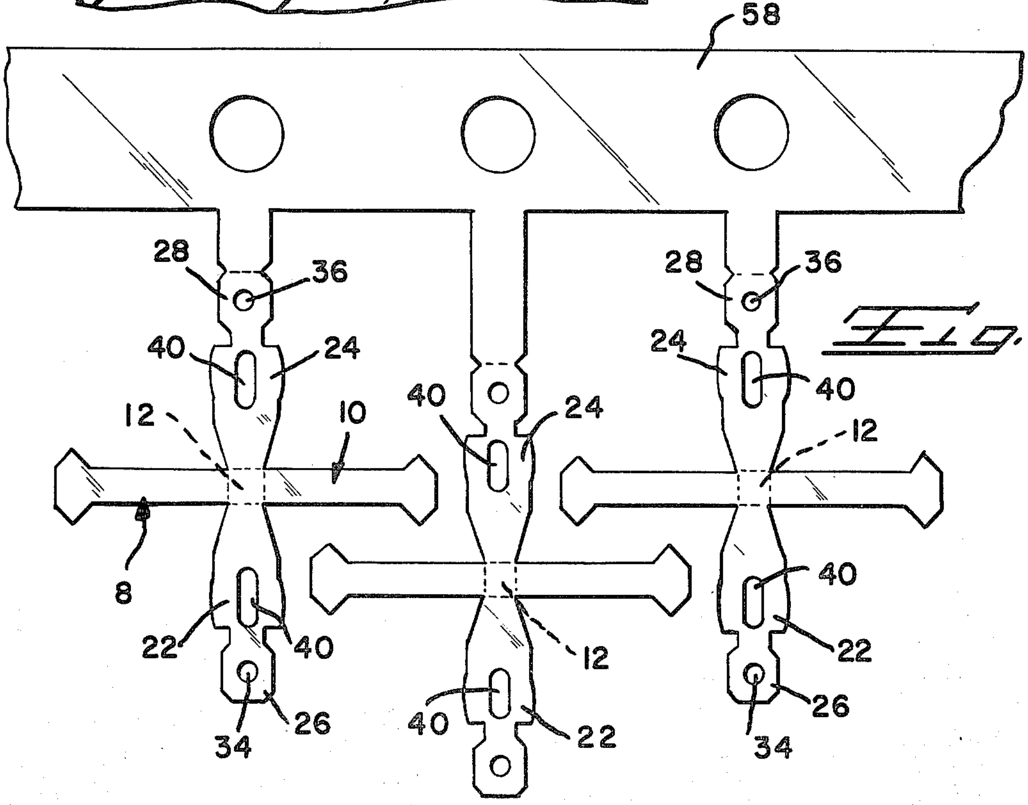
FIG. 8 is a plan view of a blank of the contacts formed on a carrier before bending of the metal has occurred.

Referring now to FIG. 1, a finished contact 1 is shown poised above an aperture 2 in a substrate 4. The contact 1 is formed from a blank of Maltese Cross configuration as shown in FIG. 8 at 6, with a pair of arms 8 and 10 joined integrally with a center section 12 and folded thereat to project upwardly and to form a pair of oppositely facing and opposed bowed contact arms as shown in FIG. 4. The facing contact arms are outwardly convex or bowed and have integral upper free end portions 13 and 14 which are bent into a plurality of outwardly flared segments 16 which cooperate to define a flared, segmented cup. The cup has open seams 18 which permit the cup to separate one half from the other upon insertion and receipt of a male terminal or post between the contact arms, in a manner to be described. The segments 16 are sloped to guide and funnel a terminal or post downwardly and also between the contact arms. The contact arms abut each other at a narrow throat area 20 immediately below the flared cup shaped opening for the receptacle. The arms are advantageously prestressed in compression against each other to provide compression on the smallest of terminals or posts inserted therebetween and to provide adequate grip on an inserted terminal or post with the smallest possible deflection.

Figure 3:
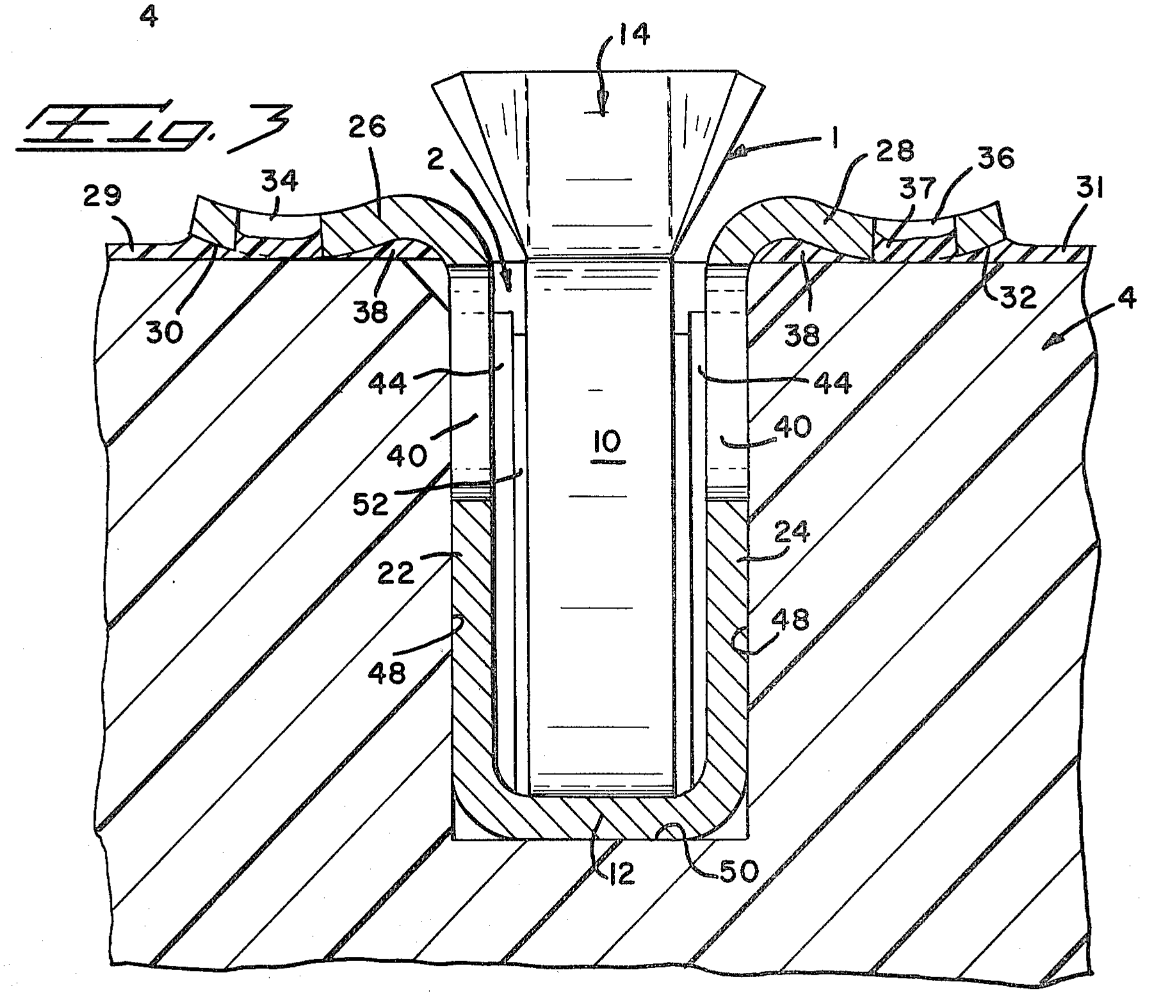
FIG. 3 is a side view in section of the fully inserted contact of FIG. 2 taken along the plane 3—3.

Another pair of arms 22 and 24 of the Maltese Cross configuration are folded up from the bottom section 12 in the manner shown in FIGS. 1 and 3 with the top portions thereof being folded into ears 26 and 28 extending away from the contact arms 13 and 14. These two ears are convex over their bottom surfaces 30 and 32 which mate with silvered epoxy circuit traces or pads, such as pads 29 and 31 on substrate 4. The ears include corresponding holes 34 and 36 which function to permit the silvered epoxy to flow up into said holes to provide better electrical and mechanical connection between the ears and the silvered epoxy pads. The convex undersurface of each ear provides a slight clearance between the periphery of the ear and the surface of the substrate. This prevents displacement of unsolidified epoxy from being squeezed out from under the ear if the same were flat. Instead the unsolidified conductive epoxy will be pushed upwardly into the aperture 34 or 36 to form a solder fillet 37. Epoxy will be pushed also into the clearance between the ear periphery and the substrate 4 to provide an annular fillet of bonding material 38 encircling the peripheral edge of the underside of each ear. The fillets 37 and 38 will be connected by a thin film of epoxy which, upon solidification, will bond the fillets to each other and to the ear with sufficient mechanical strength and with sufficient surface contact to provide good electrical joining between each ear and the corresponding circuit trace or pad.

As shown in FIGS. 1, 4, and 8, each arm 22, 24 is provided with a vertically elongated slot 40 at the upper end of each arm but below the corresponding ear 26 or 28. Each arm 22, 24 is slightly widened or bulged outwardly at 42, flanking the vertical dimension of the slot 40.

As shown in FIGS. 1-4, the substrate 4 is provided with vertical grooves 44 communicating with the recess 2 which receive the vertical edges of the corresponding arm 22, 24. As shown in FIG. 3, the arms 22 and 24 abut opposite vertical walls 46 and 48 of the recess 2. The grooves 44 are aligned with the walls 46 and 48 and wedgingly receive the vertical edges of the arms 22 and 24. FIG. 4 illustrates that the bulged portions 42 of the arms will bite into the substrate, which will occur if the substrate is fabricated of sufficiently yieldable dielectric. If not, then the bulged portions may have difficulty biting into the substrate, in which case, the presence of the slot 40 will allow resilient deflection of the bulged portions toward each other, tending to narrow the width of the slot. Thus, whether by yielding of the substrate or by deflection of the bulged portions toward each other, the arms 22 and 24 will be wedgingly retained in the recess 2. As shown in the drawings the widths of the grooves 44 are enlarged for illustration purposes. In practice, by keeping the widths to a minimum in direct relation to the thickness of the arms 22 and 24, the grooves will lock the arms against movement toward and away from each other. The receptacle thereby is rigidly held in the socket remote from the bonded ears, isolating the ears from the retention forces necessary to prevent movement of the receptacle in the substrate recess.

In the substrate 4, it can be seen that the recess 2 has chamfered edges to provide sloped funnel, lead-in surfaces to facilitate entry of the receptacle into the aperture. The bottom section 12 of the receptacle seats against the bottom wall 50 of the recess.

Figure 6:
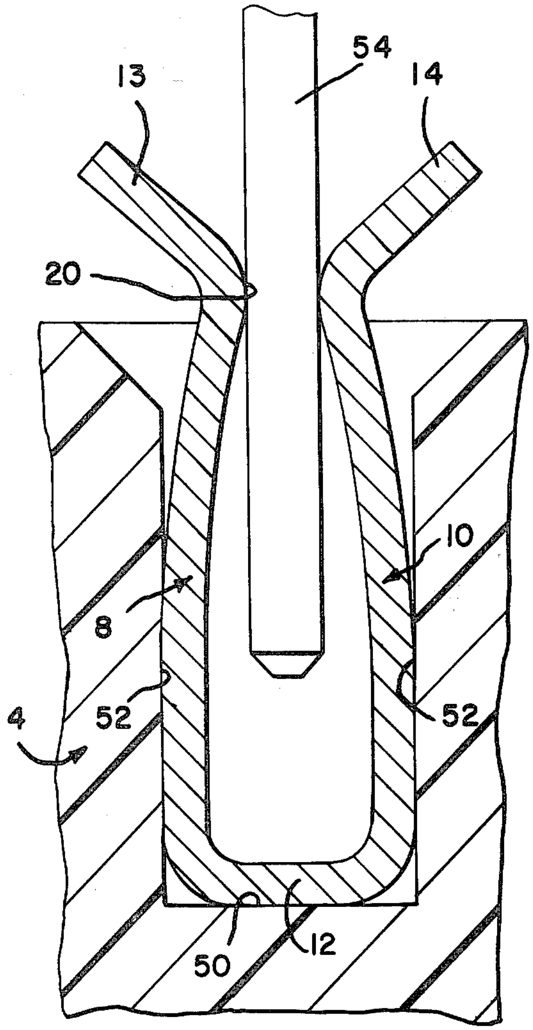
FIG. 6 is a simplified sectional view of the contact in its aperture with a small terminal or post inserted therein.
Figure 7:
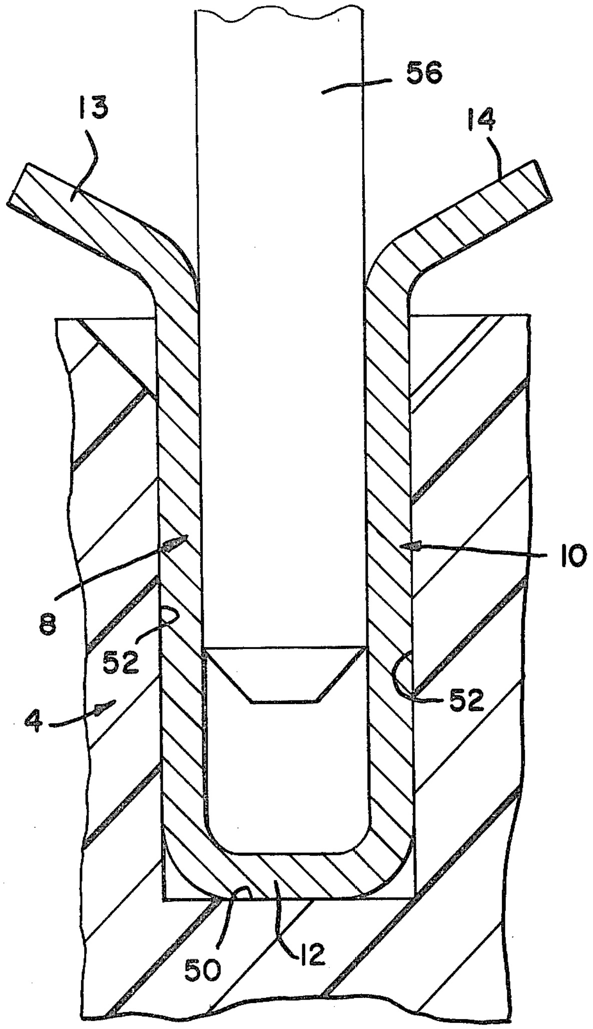
FIG. 7 is a sectional view of the contact with a large terminal or post inserted therein.

FIGS. 4, 6, and 7 illustrate the gripping function of the receptacle upon an inserted male terminal or a post to establish electrical connection therewith. The contact arms 8 and 10 are shown in FIG. 4 in their initial configuration. The arms 8 and 10 initially abut or are closely adjacent opposite side walls 52 of the recess 2, only at locations adjacent the bottom section 12. The arms are completely independent of the arms 22 and 24 and initially lean or converge toward each other until they engage at the throat area 20. The arms also are slightly bowed outwardly toward the side walls 52 along their vertical lengths. FIG. 6 illustrates the pluggable insertion into the receptacle of a male terminal or post 54 of relatively small cross-section. The terminal 54 is received between the contact arms 8 and 10 which are resiliently deflected by the presence of the terminal outwardly away from each other. Electrical connection is made by resilient gripping of the contact arms on the terminal portion at the throat area 20. It is important that the contact arms are not excessively deflected so that they are deformed to stand away from each other or to relax their gripping pressure on the terminal 54. This is accomplished by the presence of the walls 52 limiting the outward deflection. More specifically, as the convex arms 8 and 10 are deflected outwardly, progressively larger areas along the convex lengths of the contacts will be rolled out into abutment against the walls 52. In other words, the convex arms will begin to flatten progressively by rolling beam action against the walls 52 rather than to undergo excessive outward deflection or a folding or bending of a portion of an arm. The walls 52, being flat, are absent any fixed fulcrum over which the contact arms can be bent or folded.

FIG. 7 illustrates receipt of a maximum size terminal or post 56. In this case, substantially the entire lengths of the arms 8 and 10 are flattened against the walls 52. No single section of the arms have undergone excessive deflection or have been deformed by a bend or fold. The arms 8 and 10 are fully supported by the walls without the presence of a projecting or fixed fulcrum over which the arms could be bent or folded. The terminal 56 can be withdrawn from the receptacle which will return to its original configuration shown in FIG. 4. The two terminals 54 and 56 pictorially represent the extremes in the range of sizes for receipt by the receptacle 1. The range can exceed a size factor greater than two. The rolling beam feature and the independent prestressed features of the contact arms permit miniaturization of the receptacle. For example, the receptacle height is 130 thousandths and is inserted into a recess generally rectangular in cross section of 40 by 70 thousandths. This size receptacle will accept either a round or square cross section post of 13–26 thousandths.

Figure 9:
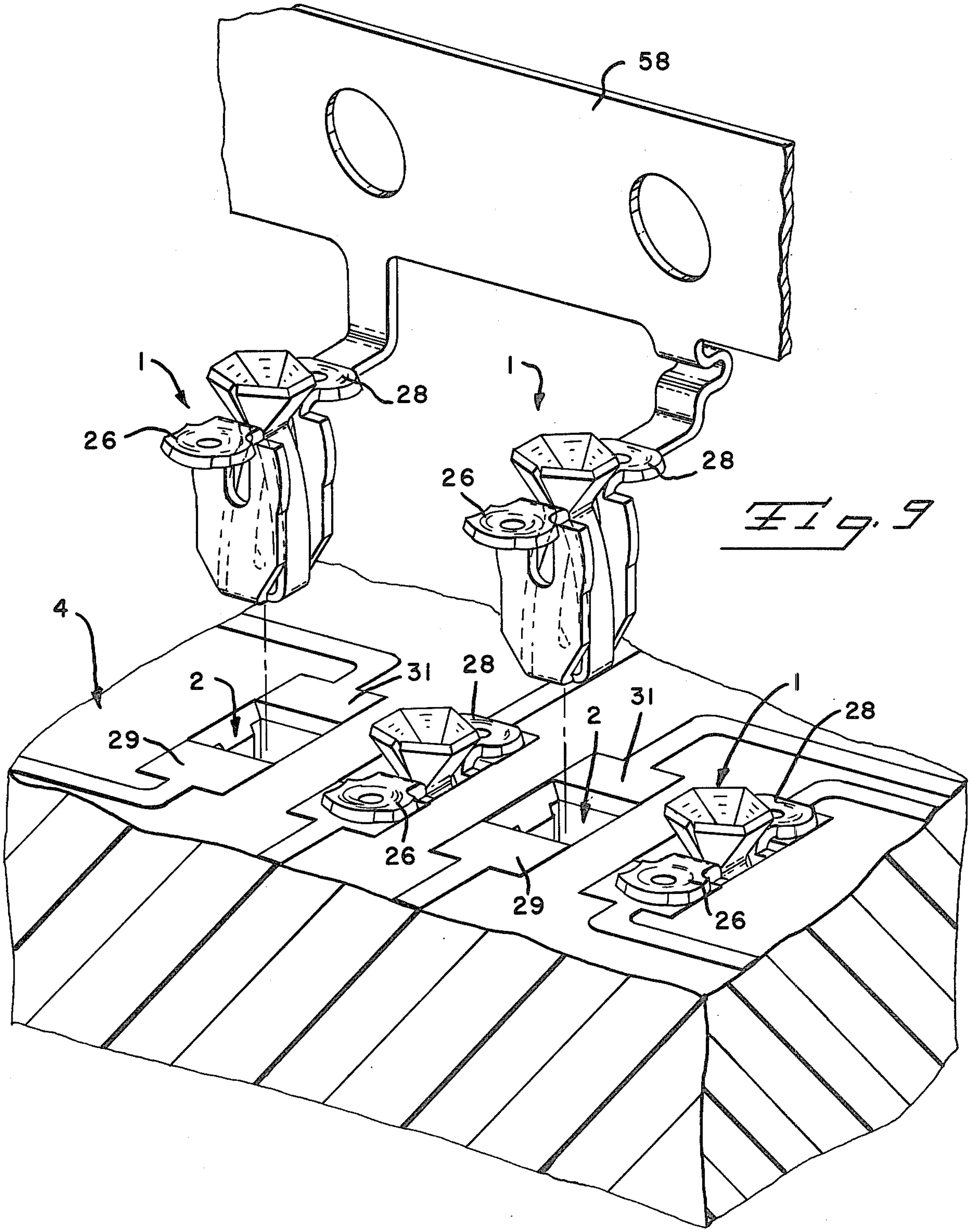
FIG. 9 is a fragmentary perspective with parts exploded to show one form of assembling the strip carried contacts into a row of apertures in a substrate.

In FIG. 9, there is shown a preferred assembly operation, whereby two or more receptacles 1 are formed along a removable carrier strip 58. The insertion of receptacles along the carrier strip into alternate recesses 2 of the substrate 4 allows close spacing of adjacent receptacles in the substrate. It is to be noted that in a prior assembly operation, two additional receptacles 1 have been already inserted in alternate recesses 2 and the accompanying carrier strip broken off and discarded.

Further in FIG. 9, it can be seen that the ears 24 and 26 are positioned at right angles to the alignment of the row or rows of receptacles in the substrate, thereby permitting closer center spacing of the receptacles in the recesses 2.

It is to be understood that the form of the invention shown and described herein is but a preferred embodiment thereof and that various changes can be made in configuration and proportionate sizes without departing from the spirit and scope of the invention.

What is claimed is:

1. In the combination of a post receiving terminal and a substrate with conductive pads on the surface thereof and an aperture therein for retaining said terminal, wherein said terminal forms a cross in its blank form with four arms extending outwardly at right angles from one another and from opposite sides of a central portion, the terminal comprising in its completed form, a pair of bowed first arms extending upwardly from opposite sides of said central portion with bowed surfaces adjacent to and facing each other to receive and engage a terminal post therebetween and with free ends of said first arms forming a flared entry for a terminal post, the improvement comprising:

a pair of second arms extending upwardly from said central portion with their top free ends bent away from said first arms to form a pair of ears which engage said pads on said substrate surface when said terminal is in said aperture, said aperture comprising a first pair of substantially parallel side walls facing said first arms, and grooves extending vertically along the edges of said side walls frictionally receiving the edges of said second arms to retain said terminal in said aperture.

2. The structure as recited in claim 1, wherein, the side edges of each said second arms form outwardly bowed beam-like members on either side of a slot which tends to narrow in width upon deflection of said side edges toward each other.

3. The structure as recited in claim 1, wherein, each of said ears includes an opening therethrough for receiving solidifiable conductive material for electrically connecting said ears and said pads.

4. The structure as recited in claim 3, wherein, each of said ears includes a convex undersurface providing a clearance between the ear periphery and the surface of said substrate.

5. The structure as recited in claim 1, wherein, said free ends of said first arms cooperate to form a cup shaped entry having open seams which permit said cup shaped entry to separate one half from the other to facilitate entry of a terminal post between said first arms.

* * * * *